(12) United States Patent
Razdan et al.

(10) Patent No.: US 11,391,888 B2
(45) Date of Patent: Jul. 19, 2022

(54) WAFER-SCALE FABRICATION OF OPTICAL APPARATUS

(71) Applicant: Cisco Technology, Inc., San Jose, CA (US)

(72) Inventors: Sandeep Razdan, Burlingame, CA (US); Vipulkumar K. Patel, Breinigsville, PA (US); Mark A. Webster, Bethlehem, PA (US); Matthew J. Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 222 days.

(21) Appl. No.: 16/677,404

(22) Filed: Nov. 7, 2019

(65) Prior Publication Data
US 2021/0141154 A1 May 13, 2021

(51) Int. Cl.
| | |
|---|---|
| *H01L 21/762* | (2006.01) |
| *H01L 23/48* | (2006.01) |
| *H01L 23/498* | (2006.01) |
| *G02B 6/12* | (2006.01) |
| *G02B 6/122* | (2006.01) |
| *G02B 6/30* | (2006.01) |
| *H01L 21/48* | (2006.01) |

(52) U.S. Cl.
CPC .......... *G02B 6/1228* (2013.01); *G02B 6/305* (2013.01); *H01L 21/486* (2013.01); *H01L 21/76243* (2013.01); *H01L 23/481* (2013.01); *H01L 23/49827* (2013.01); *G02B 2006/12085* (2013.01)

(58) Field of Classification Search
None
See application file for complete search history.

(56) References Cited

U.S. PATENT DOCUMENTS

| | | | |
|---|---|---|---|
| 8,842,945 B2 * | 9/2014 | Nguyen | H01L 25/167 385/14 |
| 10,267,990 B1 * | 4/2019 | Yu | H05K 1/181 |
| 10,393,959 B1 | 8/2019 | Razdan et al. | |

(Continued)

OTHER PUBLICATIONS

Francoise von Trapp, "Hybrid Bonding: From Concept to Commerialization," Apr. 2, 2018, 2 pages.

(Continued)

*Primary Examiner* — Rhonda S Peace
(74) *Attorney, Agent, or Firm* — Patterson + Sheridan, LLP

(57) ABSTRACT

Aspects described herein include a method comprising bonding a photonic wafer with an electronic wafer to form a wafer assembly, removing a substrate of the wafer assembly to expose a surface of the photonic wafer or of the electronic wafer, forming electrical connections between metal layers of the photonic wafer and metal layers of the electronic wafer, and adding an interposer wafer to the wafer assembly by bonding the interposer wafer with the wafer assembly at the exposed surface. The interposer wafer comprises through-vias that are electrically coupled with the metal layers of one or both of the photonic wafer and the electronic wafer. The method further comprises dicing the wafer assembly to form a plurality of dies. A respective edge coupler of each die is optically exposed at an interface formed by the dicing.

23 Claims, 9 Drawing Sheets

(56) References Cited

U.S. PATENT DOCUMENTS

| | | | |
|---|---|---|---|
| 10,777,430 B2* | 9/2020 | Yu | H01L 23/5226 |
| 2016/0225743 A1* | 8/2016 | Jeong | H01L 23/49816 |
| 2017/0047312 A1 | 2/2017 | Budd et al. | |
| 2017/0139132 A1* | 5/2017 | Patel | G02B 6/4206 |
| 2018/0122785 A1* | 5/2018 | Fiorentino | H01L 24/94 |
| 2019/0331941 A1* | 10/2019 | Coolbaugh | G02F 1/095 |
| 2021/0141154 A1* | 5/2021 | Razdan | H01L 24/32 |

OTHER PUBLICATIONS

GlobalFoundries, "Arm Close in on 3D Chip Integration," IEEE Spectrum [Accessed Online Oct. 22, 2019] spectrum.ieee.org/tech-talk.

U.S. Appl. No. 16/543,441 "Photonic Integrated Circuit Bonded With Interposer," filed Aug. 16, 2019.

PCT Notification of Transmittal of the International Search Report and the Written Opinion of the International Searching Authority, or the Declaration for Application No. PCT/US2020/059104 dated Feb. 12, 2021.

* cited by examiner

FIG. 6C
![510A]
FIG. 6D { 505 / 510A }
FIG. 6E { 505 / 510A }
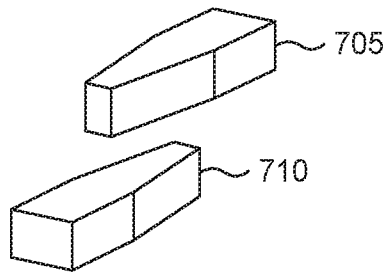
FIG. 7A
FIG. 7B

WAFER-SCALE FABRICATION OF OPTICAL APPARATUS

TECHNICAL FIELD

Embodiments presented in this disclosure generally relate to photonic devices, and more specifically, to fabricating photonic devices with edge couplers.

BACKGROUND

Photonic chips can include optical interfaces to permit optical signals to be received from an optical source (e.g., a laser or an optical fiber) and/or transmitted to an optical fiber or detector. Some photonic chips include grating couplers disposed at the top of the photonic chip. However, grating couplers are sensitive to wavelength and polarization and require very stringent process control, which tends to increase the cost of the photonic chip and/or reducing the manufacturing yield. Other photonic chips include edge couplers, which can be disposed at the sides of the photonic chip and are easier to manufacture and can provide wavelength-independent and improved optical coupling over grating couplers.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 6A-6E illustrates cross-sectional views of the edge coupler of FIG. 5, according to one or more embodiments.

FIGS. 7A and 7B illustrate views of a tapered waveguide, according to one or more embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
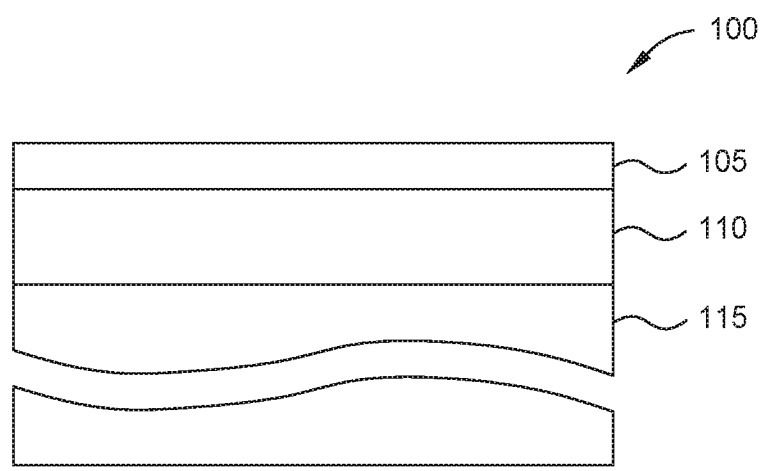
FIG. 1 illustrates a silicon-on-insulator (SOI) device, according to one or more embodiments.

One embodiment presented in this disclosure is a method comprising bonding a photonic wafer with an electronic wafer to form a wafer assembly, removing a substrate of the wafer assembly to expose a surface of the photonic wafer or of the electronic wafer, forming electrical connections between metal layers of the photonic wafer and metal layers of the electronic wafer, and adding an interposer wafer to the wafer assembly by bonding the interposer wafer with the wafer assembly at the exposed surface. The interposer wafer comprises through-vias that are electrically coupled with the metal layers of one or both of the photonic wafer and the electronic wafer. The method further comprises dicing the wafer assembly to form a plurality of dies, wherein a respective edge coupler of each die is optically exposed at an interface formed by the dicing.

Another embodiment is a method comprising forming a plurality of optical components in a photonic wafer. The plurality of optical components comprises a plurality of edge couplers. The method further comprises forming a plurality of electronic components in an electronic wafer, bonding the photonic wafer with the electronic wafer to form a wafer assembly, forming electrical connections between the plurality of optical components and the plurality of electronic components, and adding an interposer wafer to the wafer assembly by bonding the interposer wafer with an external surface of the wafer assembly. The interposer wafer comprises through-vias that are electrically coupled with one or both of the plurality of optical components and the plurality of electronic components. The method further comprises dicing the wafer assembly to form a plurality of dies. A respective edge coupler of each die is optically exposed at an interface formed by the dicing.

Another embodiment is a wafer assembly for forming a plurality of dies. The wafer assembly comprises a photonic wafer comprising a plurality of optical components. The plurality of optical components comprises a plurality of edge couplers that are arranged such that a respective edge coupler of each die of the plurality of dies will be optically exposed at a dicing interface. The wafer assembly further comprises an electronic wafer having a first surface bonded with a second surface of the photonic wafer. The electronic wafer comprises a plurality of electronic components, and electrical connections are formed between the plurality of optical components and the plurality of electronic components. The wafer assembly further comprises an interposer wafer bonded with a third surface that is one of: a surface of the electronic wafer opposite the first surface, and a surface of the photonic wafer opposite the second surface. The wafer assembly further comprises a plurality of through-vias extending through the interposer wafer. The plurality of through vias is electrically coupled with one or both of the plurality of optical components and the plurality of electronic components.

Example Embodiments

Integrated circuits (ICs) included in switches and other networking devices continue to have increases in processing capacity and speed; hence, moving massive data in and out of these switches and networking devices poses a significant challenge. Optical input/output solutions are highly desired to overcome this challenge. Silicon photonics is a promising technology that can be used to solve this problem. By using a silicon photonics platform to fabricate the optical components, existing IC assembly infrastructure can be utilized, which tends to reduce fabrication costs and supports scaling up.

In some cases, fabrication and/or packaging of the silicon photonics-based optical components remains compatible with complementary metal-oxide-semiconductor (CMOS) fabrication and/or packaging techniques. Some non-limiting examples include surface-mount technologies such as controlled collapse chip connection (also known as "C4" or "flip chip"), ball grid array (BGA), and so forth. Additionally, it may be beneficial to reduce the overall package footprint of the optical components, which can support high signal and power integrity (e.g., supporting high speeds and advanced modulation techniques such as 112G PAM4) and has low power requirements and parasitics.

Embodiments described herein include methods of fabrication of an optical apparatus that allow a cost-effective realization of high-speed optical input/output for high data rate transceiver modules and in-package optics applications. More specifically, the methods of fabrication include wafer-scale assembly of a photonic wafer with an electronic wafer, reducing costs, complexity, and cycle time for downstream fabrication processes, while improving fabrication yield and supporting high speed/power integrity operation. By bonding the photonic wafer with the electronic wafer at wafer-scale, the need for separately packaging electrical ICs and photonic ICs in downstream fabrication processes is eliminated. Additionally, bonding the photonic wafer with the electronic wafer at wafer-scale tends to improve input/output coupling, reduces parasitics, and supports a small form factor for an optical engine to be co-packaged with an IC.

FIG. 1 illustrates a silicon-on-insulator (SOI) device 100, according to one or more embodiments. The SOI device 100 includes a surface layer 105, an insulation layer 110 (also referred to as a buried oxide (BOX) layer), and a semiconductor substrate 115. Although the embodiments herein refer to the surface layer 105 and semiconductor substrate 115 as silicon, the disclosure is not limited to such. For example, other semiconductors or optically transmissive materials may be used to form the structure shown here. Moreover, the surface layer 105 and the semiconductor substrate 115 may be made of the same material, but in other embodiments, the surface layer 105 and the semiconductor substrate 115 are made from different materials.

The thickness of the surface layer 105 may range from less than 100 nanometers to greater than a micron. More specifically, the surface layer 105 may be between 100-300 nanometers thick. The thickness of the insulation layer 110 may vary depending on the desired application. In one embodiment, the thickness of the insulation layer 110 may range from less than one micron to tens of microns. The thickness of the semiconductor substrate 115 may vary widely depending on the specific application of the SOI device 100. For example, the semiconductor substrate 115 may be the thickness of a typical semiconductor wafer (e.g., 100-700 microns) or may be thinned and mounted on another substrate.

For optical applications, the silicon surface layer 105 and insulation layer 110 (e.g., silicon dioxide, silicon nitride, silicon oxynitride, and the like) may provide contrasting refractive indexes that confine an optical signal in a silicon waveguide in the surface layer 105. In a later processing step, the surface layer 105 may be etched to form one or more silicon waveguides. Because silicon has a higher refractive index compared to an insulator such as silicon dioxide, the optical signal tends to remain primarily in the silicon waveguide as it propagates across the surface layer 105. In addition, other layer(s) such silicon nitride layer(s) can also be deposited during the fabrication for forming additional light guiding waveguide layers.

Figure 2A:
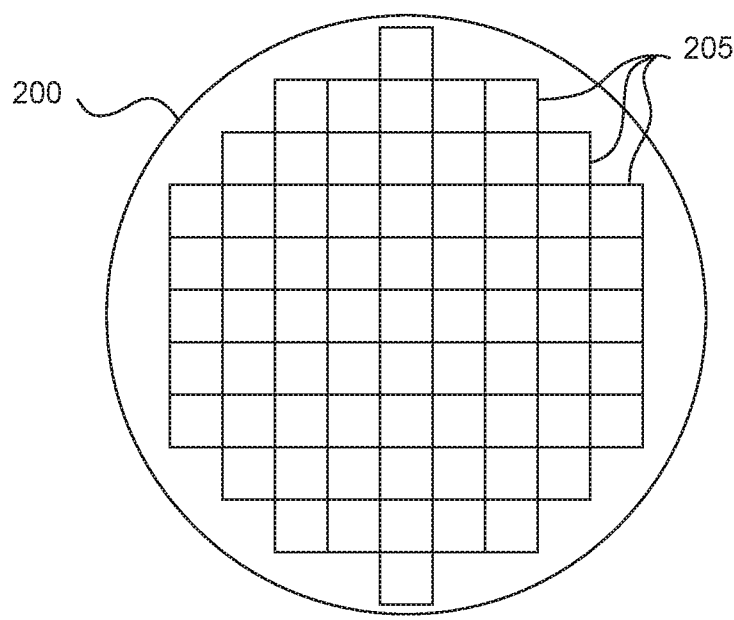
FIGS. 2A and 2B illustrate an exemplary wafer assembly comprising a photonic wafer bonded with an electronic wafer, according to one or more embodiments.
Figure 2B:
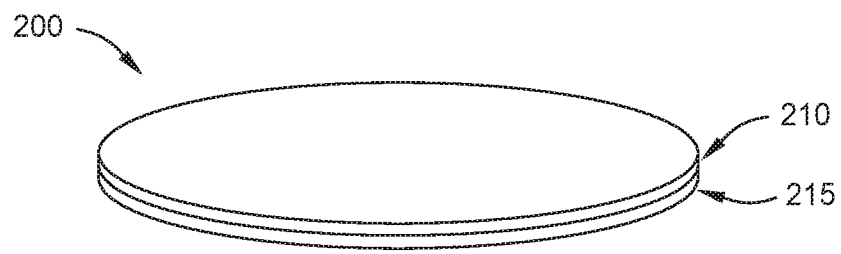
Figure 3A:
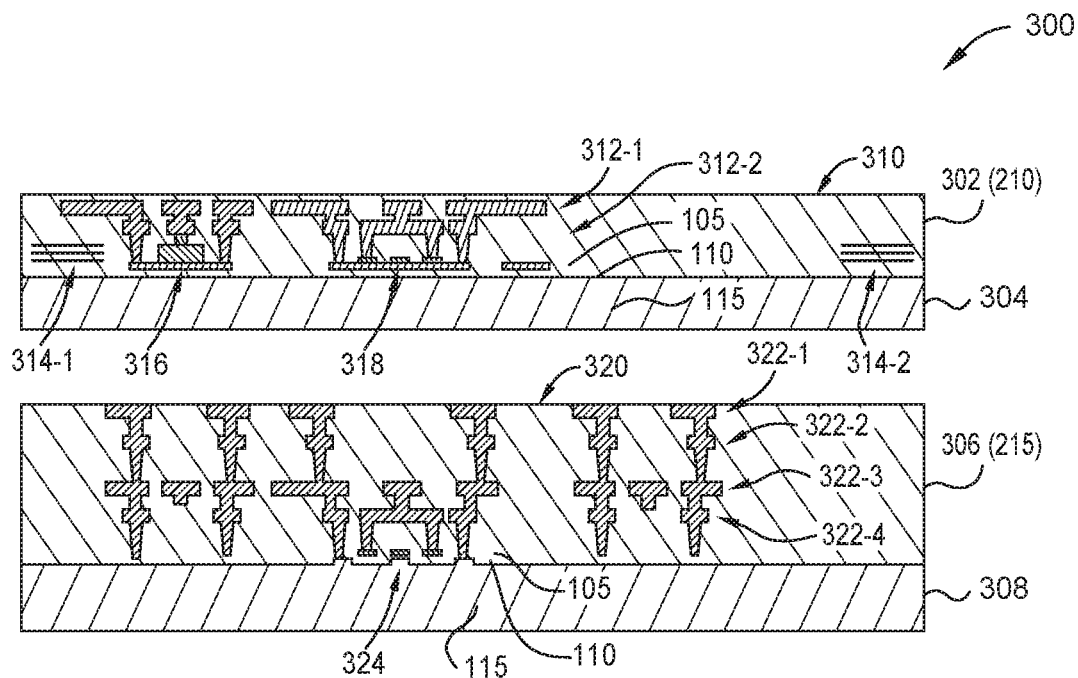
FIGS. 3A-3I illustrate an exemplary sequence for fabricating an optical apparatus, according to one or more embodiments.
Figure 3B:
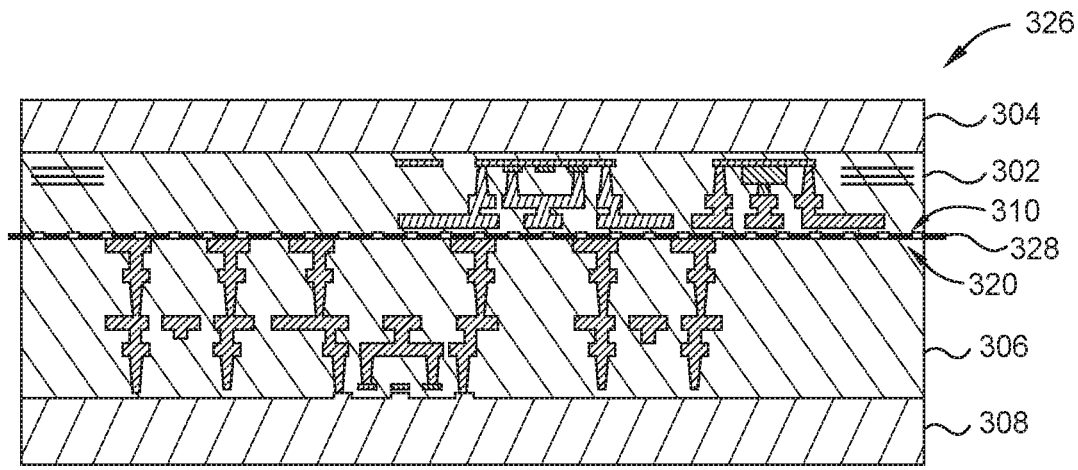
Figure 3C:
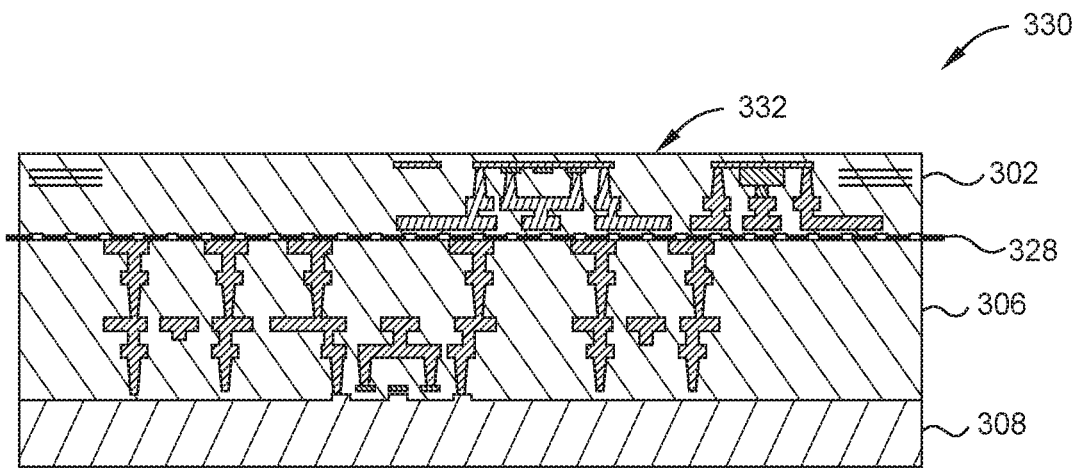
Figure 3D:
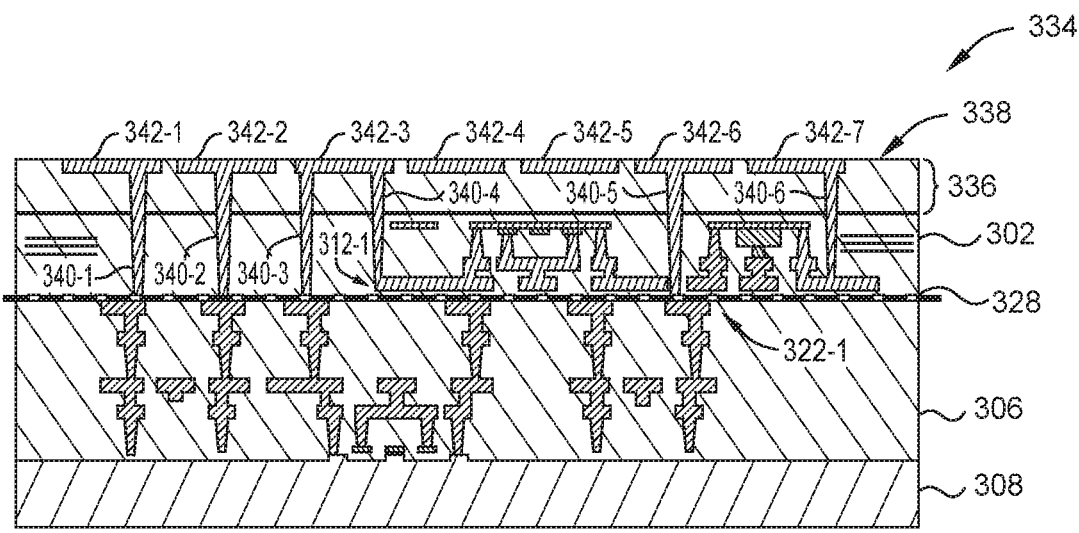
Figure 3E:
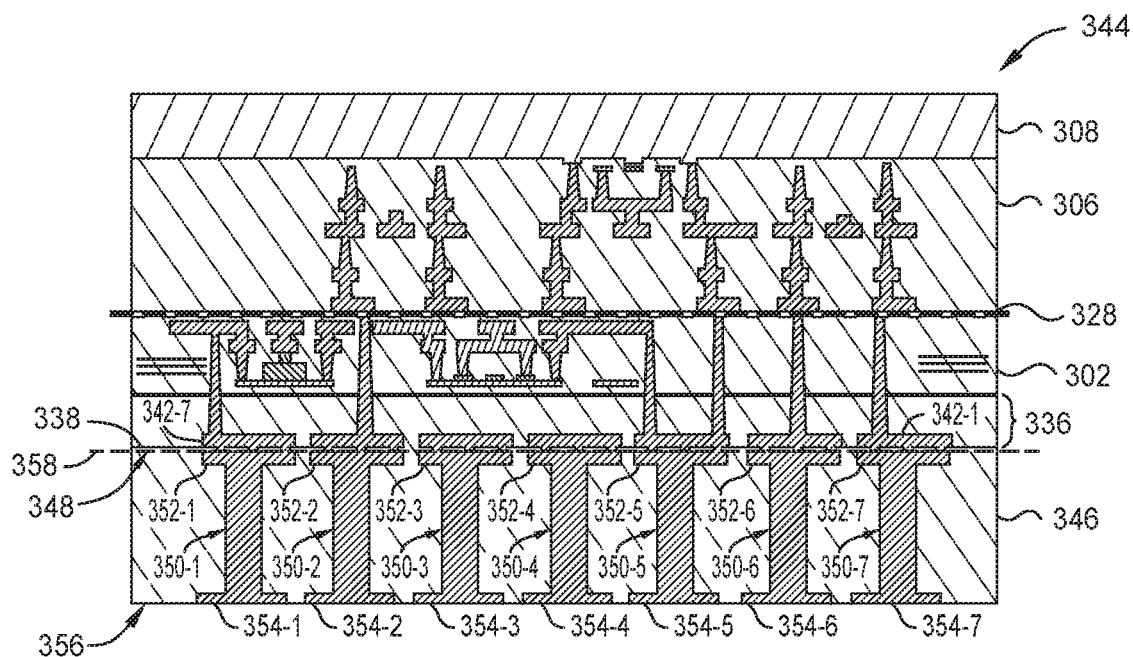
Figure 3F:
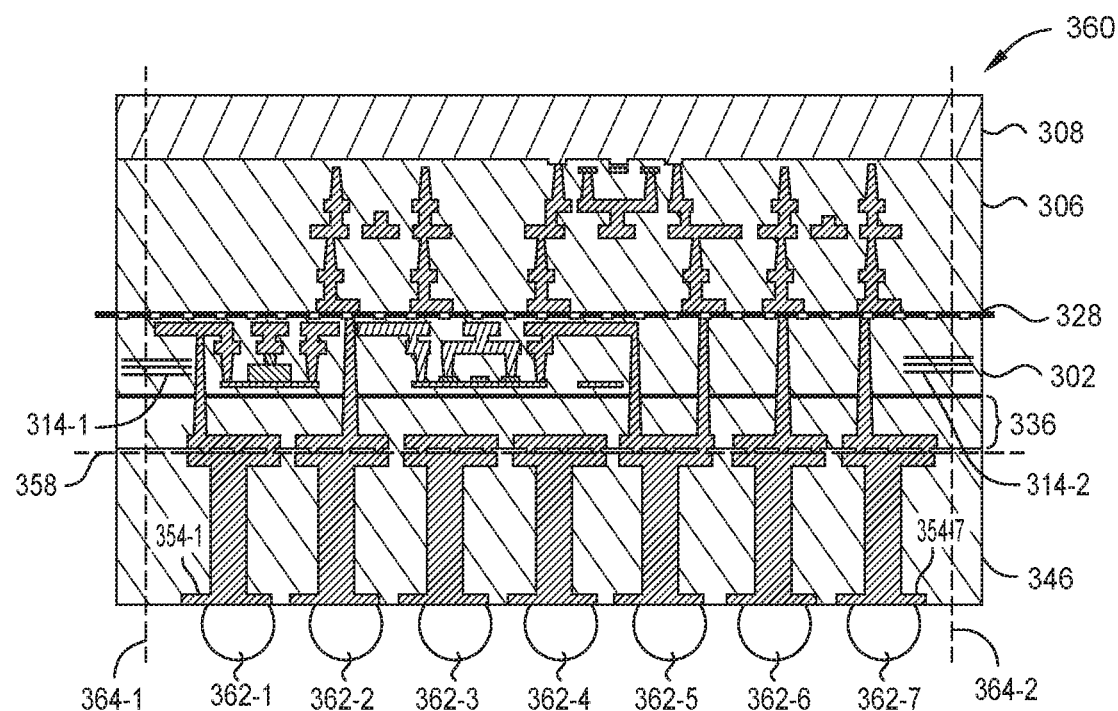
Figure 3G:
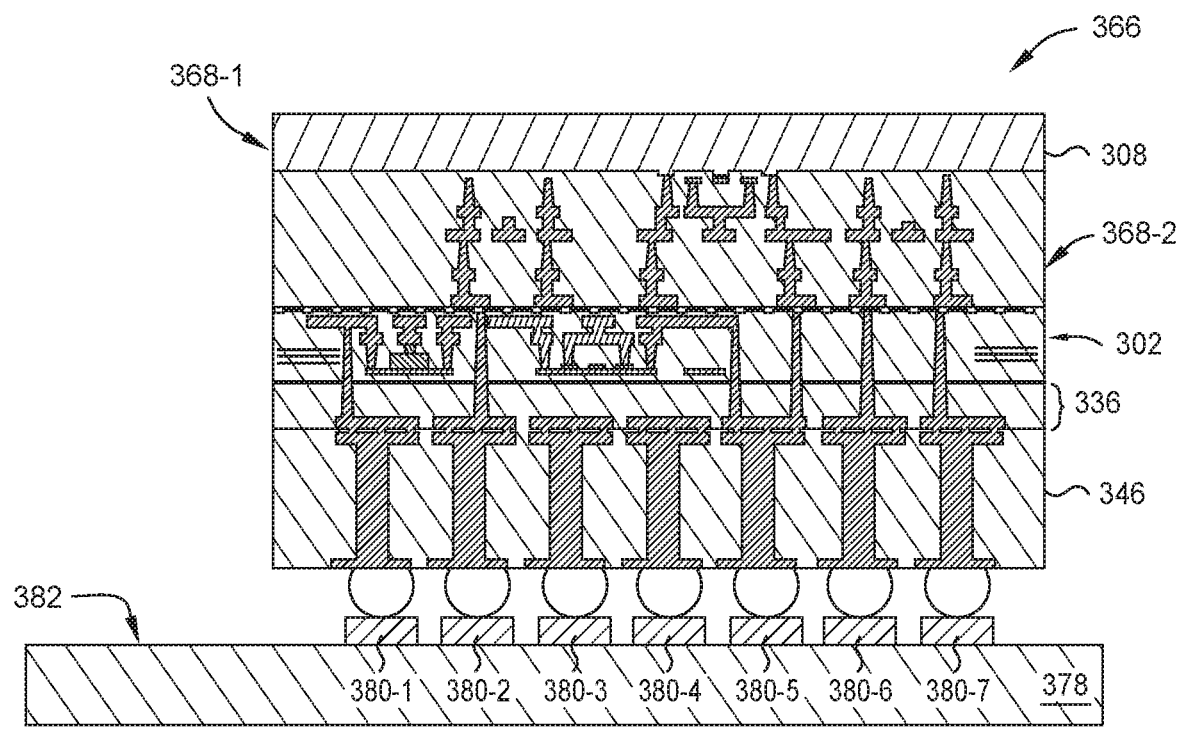
Figure 3H:
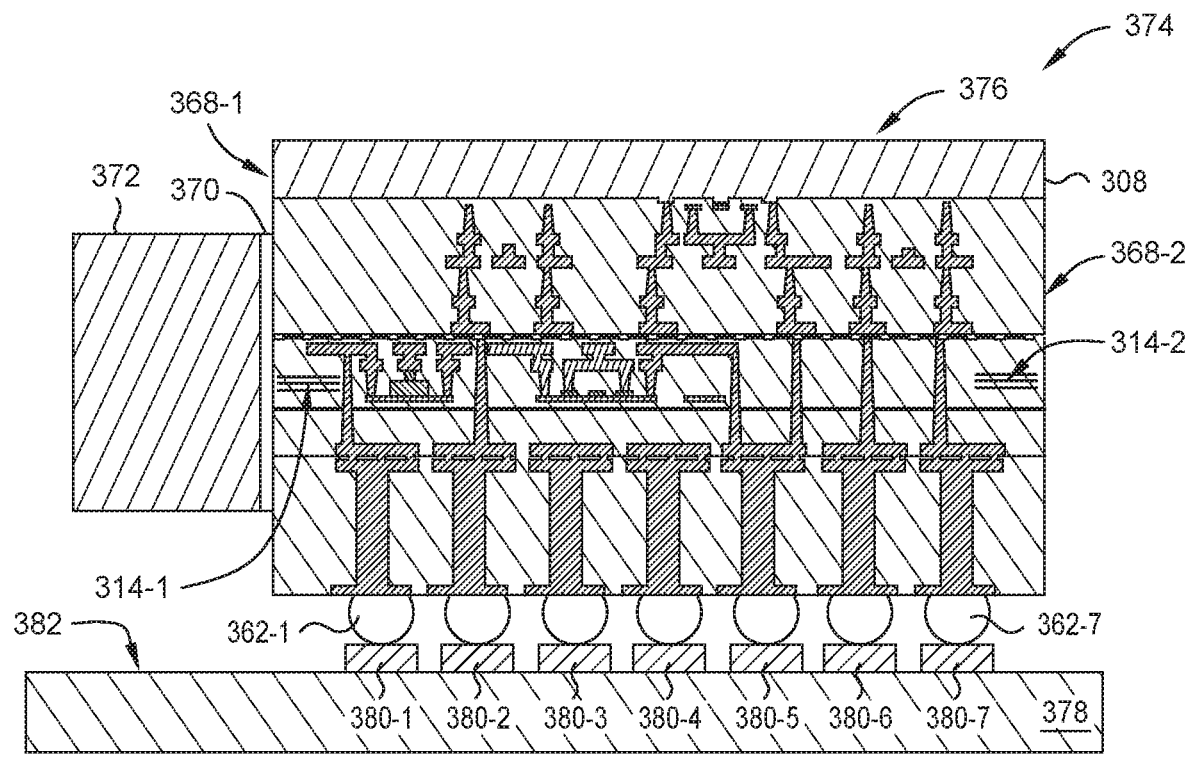
Figure 3I:
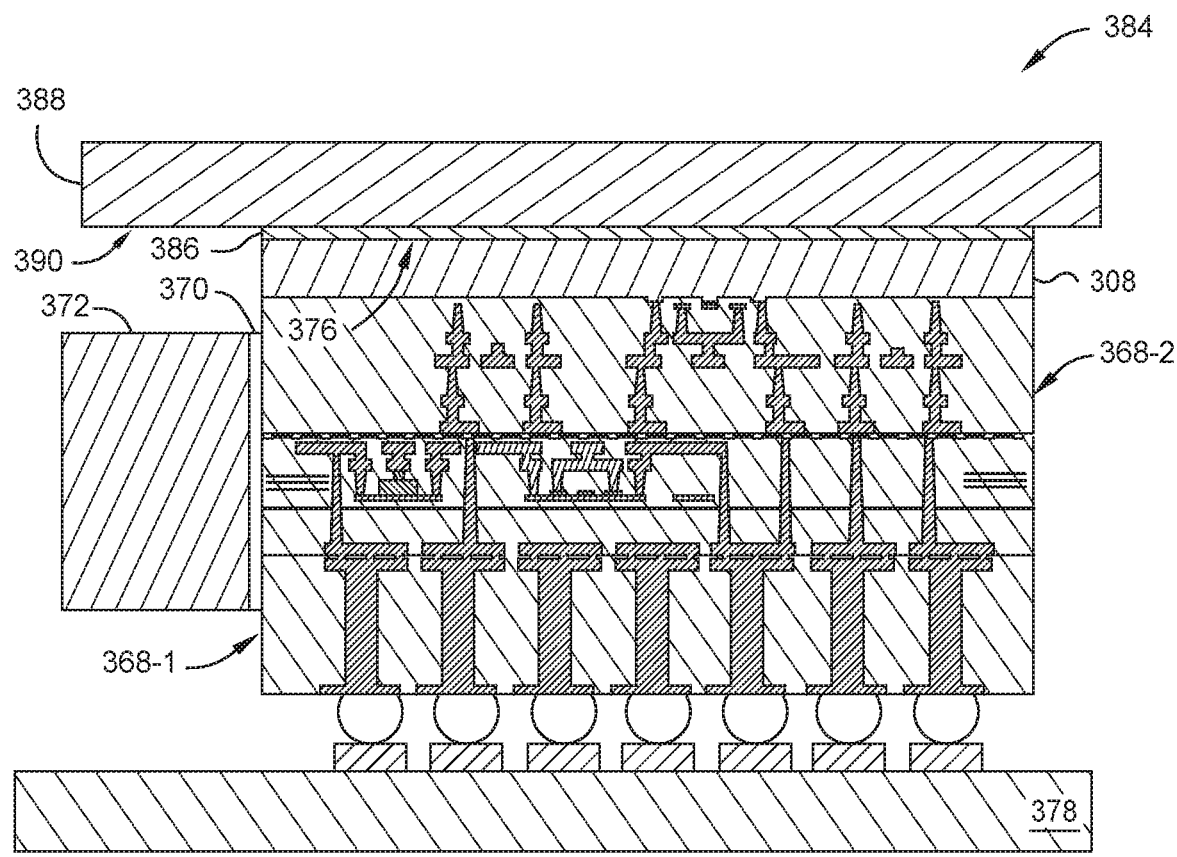

FIGS. 2A and 2B illustrate an exemplary wafer assembly 200 comprising a photonic wafer 210 bonded with an electronic wafer 215, according to one or more embodiments. More specifically, FIG. 2A is a top view of the wafer assembly 200 and FIG. 2B provides a perspective view of the wafer assembly 200. The photonic wafer 210 and the electronic wafer 215 may be formed of any suitable semiconductor material(s), which are discussed in greater detail below.

As shown, the wafer assembly 200 includes a plurality of rectangularly-shaped photonic chips 205 (e.g., between about 10 and about 200 photonic chips). Instead of forming a single photonic chip 205 at a time, the wafer assembly 200 enables the same fabrication steps to be used to form multiple photonic chips 205 in parallel. The wafer assembly 200 can be diced to separate adjacent photonic chips 205. In some embodiments, a dicing process used to dice the wafer assembly 200 comprises one or more of mechanical sawing, scribing and cleaving, and laser cutting.

In some embodiments based on one or more SOI devices, each photonic chip 205 includes the insulation layer 110 and the semiconductor substrate 115 shown in FIG. 1. However, the surface layer 105 has been processed to include various optical components (e.g., waveguides, couplers, modulators, detectors, etc.) and/or electronic components. For example, the optical components may be formed by performing various fabrication steps on the surface layer 105, such as etching or doping the silicon material of the surface layer 105, as well as depositing or growing additional materials. In some embodiments, one of the photonic wafer 210 and the electronic wafer 215 is fabricated using an SOI device. In other embodiments, both of the photonic wafer 210 and the electronic wafer 215 are fabricated using SOI devices.

In some embodiments, adjacent photonic chips 205 each include respective edge couplers (not shown) that are optically exposed at a side surface formed by the dicing process. The edge couplers may be designed to efficiently couple to the external light-carrying medium. In some embodiments, use of the edge couplers may mitigate the optical losses associated with transmitting optical signals through the side surface.

FIGS. 3A-3I illustrate an exemplary sequence for fabricating an optical apparatus, according to one or more embodiments. More specifically, diagrams 300, 326, 330, 334, 344, 360, 366, 374, 384 depict different stages of fabrication for the optical apparatus. Although the optical apparatus is depicted as a single photonic chip (e.g., a single die), it will be understood that other photonic chips may be fabricated in parallel in a wafer-scale fabrication.

In the diagram 300, a photonic wafer 302 (one example of the photonic wafer 210 of FIG. 2B) and an electronic wafer 306 (one example of the electronic wafer 215 of FIG. 2B) are separate from each other. In some embodiments, each of the photonic wafer 302 and the electronic wafer 306 is formed using a SOI device (e.g., including at least a surface layer 105, an insulation layer 110, and a semiconductor substrate 115). The photonic wafer 302 comprises one or more optical components, and the electronic wafer 306 comprises one or more electronic components. The optical components and/or the electrical components may be formed partly in the surface layer 105 and/or one or more layers formed above the surface layer 105 (e.g., additional optical waveguide layers).

As shown, the photonic wafer 302 comprises a plurality of optical components: edge couplers 314-1, 314-2, an optical detector 316, and an optical modulator 318. The plurality of optical components may be optically coupled with each other. For example, during operation the edge coupler 314-1 may receive an optical signal from an external light-carrying medium, the optical detector 316 detects the optical signal, the optical modulator 318 modulates the optical signal, and the edge coupler 314-2 externally couples the modulated optical signal (e.g., through an edge of the photonic chip to another external light-carrying medium). In some configurations the edge coupler 314-1 receives a modulated optical signal, and the optical detector 316 detects the modulated optical signal and converts it into an electrical signal.

The photonic wafer 302 further comprises a top surface 310, a plurality of metal layers 312-1, 312-2, vias that extend between the metal layers 312-1, 312-2, and vias that extend between the metal layer 312-2 and the surface layer 105 or other semiconductor layer(s). The photonic wafer 302 is disposed on a substrate 304 (e.g., a part of the semiconductor substrate 115).

As shown, the electronic wafer 306 comprises an electronic component 324. In some embodiments, the electronic component 324 comprises a transistor or other electronic circuitry comprising a transistor. The electronic wafer 306 further comprises a top surface 320, a plurality of metal layers 322-1, 322-2, 322-3, 322-4, vias that extend between the metal layers 322-1, 322-2, 322-3, 322-4, and vias that extend between the metal layer 322-4 and the surface layer 105 or other semiconductor layer(s). The electronic wafer 306 is disposed on a substrate 308 (e.g., a part of the semiconductor substrate 115).

In the diagram 326, the photonic wafer 302 is inverted (or flipped), and the top surface 310 of the photonic wafer 302 is contacted with the top surface 320 of the electronic wafer 306. A bonding process may be performed to bond the photonic wafer 302 with the electronic wafer 306 at a bond line 328, which forms a wafer assembly. In some embodiments, bonding the photonic wafer with the electronic wafer occurs by wafer-scale oxide-oxide bonding. Other suitable types of direct bonding are also contemplated. In some embodiments, the bonding process comprises wafer-scale hybrid bonding, where oxide-oxide bonding and metal interconnect are achieved in a single bonding step. For example, direct bond interconnect (DBI) or face-to-face bonding may be used where the top surfaces 310, 320 include arrays of conductive bonding sites.

In the diagram 330, a substrate is removed from the wafer assembly to expose a surface of the photonic wafer 302 or of the electronic wafer 306. As shown, the substrate 304 is removed to expose a surface 332 of the photonic wafer 302. In other embodiments, the substrate 308 may be removed to expose a surface of the electronic wafer 306. The substrate 304 or 308 may be removed using any suitable techniques, e.g., using photolithography and chemical etching processes.

In the diagram 334, additional oxide or other suitable dielectric material is added to the photonic wafer 302 above the surface 332, and vias are added to the photonic wafer 302 such that the wafer thickness is increased by a thickness 336 to extend to a surface 338, representing an external surface of the wafer assembly. A plurality of vias 340-1, 340-2, . . . , 340-6 are formed from the surface 338 and extend partly or fully through the photonic wafer 302 and/or partly or fully through the electronic wafer 306. In some embodiments, the plurality of vias 340-1, 340-2, . . . , 340-6 are formed as through-oxide vias. A plurality of conductive contacts 342-1, 342-2, . . . , 342-7 are formed at the surface 338, and coupled with a respective one or more of the vias 340-1, 340-2, . . . , 340-6.

The vias 340-1, 340-2, 340-3, 340-5 extend from the surface 338, through the photonic wafer 302, and partly through the electronic wafer 306 to the metal layer 322-1. The vias 340-4, 340-6 extend partly through the photonic wafer 302 to the metal layer 312-1. In this way, the conductive contacts 342-1, 342-2, 342-3, 342-6 are electrically coupled with electronic components of the electronic wafer 306, and the conductive contacts 342-3, 342-7 are electrically coupled with optical components of the photonic wafer 302.

In the diagram 344, the wafer assembly is inverted, and the surface 338 of the photonic wafer 302 is contacted with a surface 348 of an interposer wafer 346. The interposer wafer 346 may be formed of any suitable material, such as silicon or glass. A bonding process may be performed to bond the wafer assembly with the interposer wafer 346 at a bond line 358. In some embodiments, bonding the wafer assembly with the interposer wafer 346 occurs by wafer-scale oxide-oxide bonding. Other suitable types of direct bonding (e.g., wafer-scale hybrid bonding) are also contemplated.

The interposer wafer 346 comprises a plurality of through-vias 350-1, 350-2, . . . , 350-7 extending between a plurality of surface contacts 352-1, 352-2, . . . , 352-7 formed at the surface 348, and a plurality of surface contacts 354-1, 354-2, . . . , 354-7 formed at a surface 356 opposite the surface 348.

In the diagram 360, solder balls 362-1, 362-2, . . . , 362-7 are attached to the surface contacts 354-1, 354-2, . . . , 354-7 to form surface mount connectors that are electrically coupled with the through-vias 350-1, 350-2, . . . , 350-7. The surface mount connectors may have any suitable form, whether standardized or proprietary. For example, the solder balls 362-1, 362-2, . . . , 362-7 may be arranged as a ball grid array (e.g., having a 0.4-0.65 mm pitch), or as flip chip bumps (e.g., having a 50-150 micron pitch).

After forming the surface mount connectors, the wafer assembly may then be diced along lines 364-1, 364-2 to form a plurality of dies. In some embodiments, the lines 364-1, 364-2 are selected such that the edge couplers 314-1, 314-2 are optically exposed at interfaces formed by the dicing. As used herein, "optically exposed" means that the edge coupler 314-1, 314-2 is physically exposed at the side surface or is slightly recessed from the side surface (e.g., 1-5 microns) but can nonetheless optically couple with an external light-carrying medium. As shown in the diagram 366, the interfaces formed by the dicing are side surfaces 368-1, 368-2. Further processing of the interfaces may be performed, e.g., etching or polishing of the side surfaces 368-1, 368-2 to achieve a high optical coupling efficiency of the edge couplers 314-1, 314-2 with the external light-carrying medium.

In the diagram 366, a plurality of electrical contacts 380-1, 380-2, . . . , 380-7 are formed on a surface 382 of an integrated circuit (IC) substrate 378 or an interposer. The surface mount connectors (e.g., the solder balls 362-1, 362-2, . . . , 362-7) of the first die are electrically coupled with the electrical contacts 380-1, 380-2, . . . , 380-7.

In the diagram 374, an external light-carrying medium 372 is attached to the first die. In some embodiments, the external light-carrying medium 372 comprises one of an optical waveguide of an external photonic chip, an edge coupler of the external photonic chip, a laser, a light emitting diode, an individual optical fiber, and a fiber array unit arranging a plurality of optical fibers. In some embodiments, and as shown, the first die is electrically coupled with the IC substrate 378 prior to attaching the external light-carrying medium 372 to the first die. This ordering may be suitable in cases where the reflow temperature for attaching the solder balls 362-1, 362-2, . . . , 362-7 is higher than the epoxy cure temperature for attaching the external light-carrying medium 372. However, in other embodiments, the external light-carrying medium 372 is attached to the first die prior to electrically coupling with the IC substrate 378, which may be suitable when a low-temperature solder is used for the solder balls 362-1, 362-2, ..., 362-7 or to use an epoxy that can withstand higher temperatures.

The external light-carrying medium 372 is optically coupled with the edge coupler 314-1. Optically coupling the external light-carrying medium 372 with the edge coupler 314-1 may be achieved through passive and/or active alignment techniques. In some embodiments, the external light-carrying medium 372 and/or the first die include one or more alignment features that aid with the alignment. For example, the one or more alignment features may be dimensioned such that, when coupled with another alignment feature or a reference surface of the first die, the external light-carrying medium 372 is optically coupled with the edge coupler 314-1. Although two edge couplers 314-1, 314-2 are shown, other implementations may include different numbers of edge couplers. For example, the photonic wafer 302 may include three prong couplers: a first prong coupler for receiving unmodulated light, a second prong coupler for transmitting modulated light (e.g., on a transmit side of a transceiver), and a third prong coupler for receiving modulated light (for detection). Further, in some embodiments, an array of inputs and outputs may be formed in the photonic wafer 302 (e.g., such that the edge coupler may be a fiber array unit (FAU)).

In some embodiments, after the external light-carrying medium 372 is optically coupled with the edge coupler 314-1, an index-matching material 370 (e.g., an epoxy) is applied between the interface (here, the side surface 368-1) of the first die and the external light-carrying medium 372. In this way, the optical signal may be propagated through the index-matching material 370. The index-matching material 370 may be cured (e.g., using UV light or heat) to attach the external light-carrying medium 372 to the first die. In other embodiments, the external light-carrying medium 372 may be attached to the first die without using the index-matching material 370 for the optical coupling (e.g., removably attached using a plug or a connector).

In the diagram 384, a thermal interface material 386 is applied to a surface 376 of the substrate 308 (e.g., a portion of a second substrate that is included in the first die). Some non-limiting examples of the thermal interface material 386 include thermal grease, a gap filler (e.g., an elastomeric sheet), insulating hardware (e.g., ceramics such as aluminum oxide, aluminum nitride, beryllium oxide), thermal pads or films (e.g., silicone or graphite), thermal tape, phase change material, thermal epoxy, and so forth. A thermal lid 388 is attached to the first die through the thermal interface material 386. As shown, a surface 390 of the thermal lid 388 contacts the thermal interface material 386. The thermal lid 388 may act as a heat sink or a heat spreader. The thermal lid 388 may be formed of any suitable material(s), such as aluminum, copper, carbon-based or graphite-based composite materials, and so forth.

Figure 4:
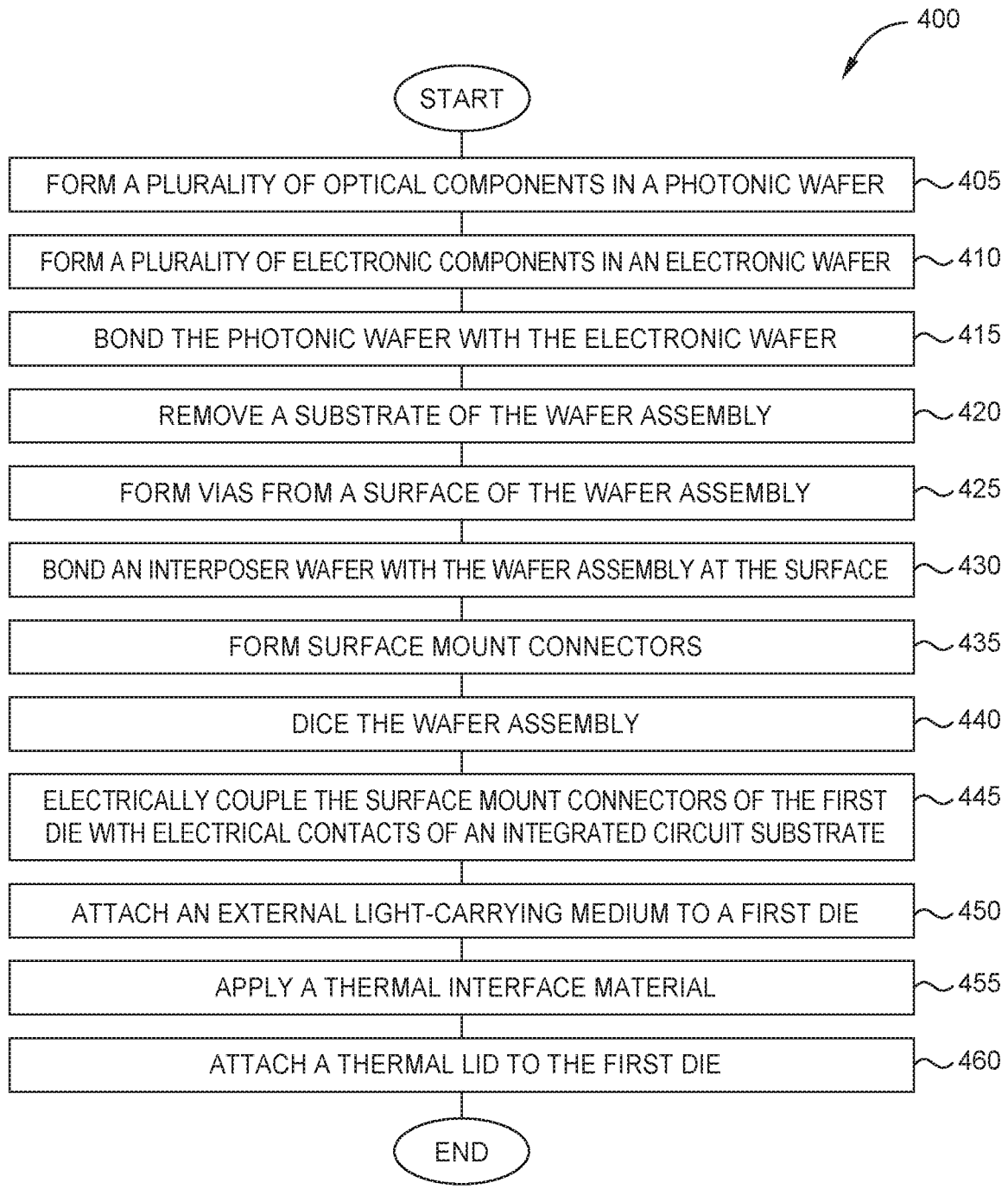
FIG. 4 is an exemplary method for fabricating an optical apparatus, according to one or more embodiments.

FIG. 4 is an exemplary method 400 for fabricating an optical apparatus, according to one or more embodiments. The method 400 may be used in conjunction with other embodiments, e.g., to perform the sequence depicted in FIGS. 3A-3I.

The method 400 begins at block 405, where a plurality of optical components are formed in a photonic wafer. In some embodiments, the photonic wafer is used to fabricate a plurality of dies, and each die comprises a respective one or more optical components. In some embodiments, the plurality of optical components are formed partly in a surface layer of a SOI substrate.

At block 410, a plurality of electronic components are formed in an electronic wafer. In some embodiments, the electronic wafer is used to fabricate a plurality of dies, and each die comprises a respective one or more electronic components. In some embodiments, the plurality of electronic components are formed partly in a surface layer of a SOI substrate.

At block 415, the photonic wafer is bonded with the electronic wafer. Bonding the photonic wafer with the electronic wafer forms a wafer assembly. In some embodiments, bonding the photonic wafer with the electronic wafer comprises wafer-scale oxide-oxide bonding. At block 420, a substrate of the wafer assembly is removed to expose a surface of the photonic wafer or of the electronic wafer. In some embodiments, the substrate of the wafer assembly comprises a semiconductor substrate of the SOI substrate. In some embodiments, removing the substrate comprises performing photolithography and chemical etching processes.

At block 425, vias are formed from an external surface of the wafer assembly. In some embodiments, the vias extend to metal layers of the photonic wafer and to metal layers of the electronic wafer. In some embodiments, the photonic wafer or the electronic wafer is grown from the exposed surface, and is increased by a thickness to define the external surface.

At block 430, an interposer wafer is bonded with the wafer assembly at the surface. In this way, the interposer wafer is added to the wafer assembly. In some embodiments, bonding the interposer wafer with the wafer assembly comprises wafer-scale oxide-oxide bonding. In some embodiments, the interposer wafer comprises through-vias that are electrically coupled with the vias. At block 435, surface mount connectors are formed on the wafer assembly. In some embodiments, solder balls may be attached to surface contacts of the interposer wafer.

At block 440, the wafer assembly is diced to form a plurality of dies. In some embodiments, dicing the wafer assembly comprises one or more of mechanical sawing, scribing and cleaving, and laser cutting. Other suitable dicing techniques are also contemplated. In some embodiments, a respective edge coupler of each die is optically exposed at an interface formed by dicing the wafer assembly.

At block 445, the surface mount connectors of the first die are electrically coupled with electrical contacts of an integrated circuit substrate. At block 450, an external light-carrying medium is attached to a first die. In some embodiments, the blocks 445, 450 are performed in a reverse order. In some embodiments, the external light-carrying medium comprises one of an optical waveguide of an external photonic chip, an edge coupler of the external photonic chip, a laser, a light emitting diode, an individual optical fiber, and a fiber array unit arranging a plurality of optical fibers.

In some embodiments, attaching the external light-carrying medium comprises optically coupling the external light-carrying medium with an edge coupler of the first die. Optically coupling the external light-carrying medium with the edge coupler may be achieved through passive and/or active alignment techniques. In some embodiments, attaching the external light-carrying medium comprises applying an index-matching material (e.g., an epoxy) between the interface of the first die and the external light-carrying medium. The index-matching material may be cured (e.g., using UV light or heat) to attach the external light-carrying medium to the first die.

At block 455, a thermal interface material is applied to a surface of the substrate. At block 460, a thermal lid (e.g., a heat sink or a heat spreader) is attached to the first die, such that a surface of the thermal lid contacts the thermal interface material. The method 400 ends following completion of block 460.

Figure 5:
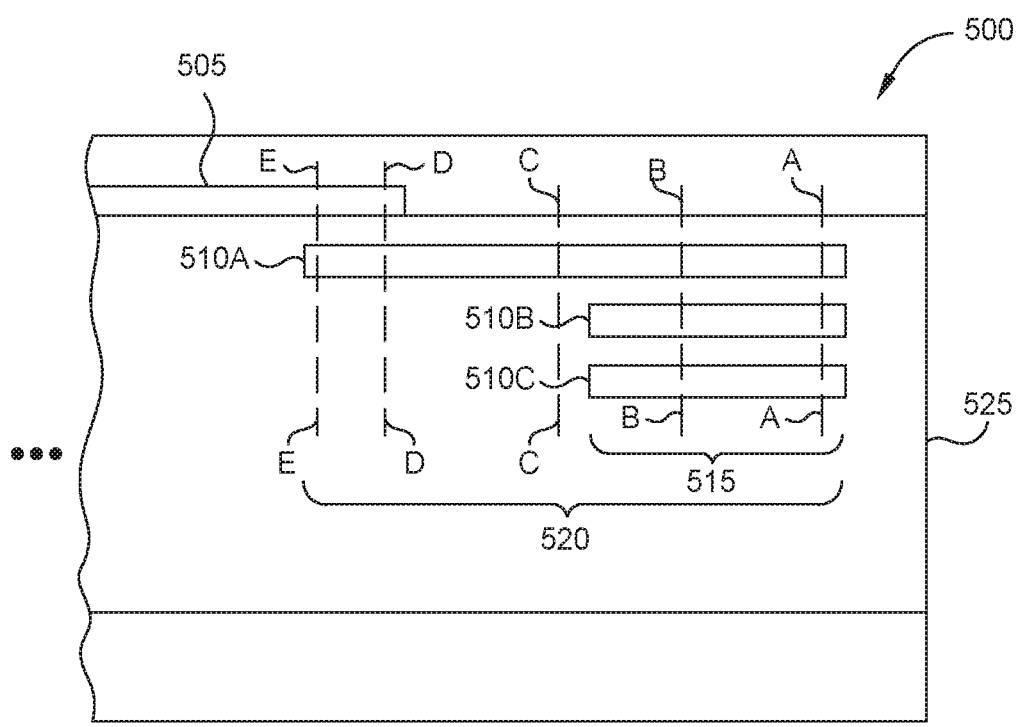
FIG. 5 illustrates a side view of a photonic chip that includes an edge coupler, according to one or more embodiments.

FIG. 5 illustrates a side view 500 of a photonic chip that includes an edge coupler 520 formed using a multi-prong, embedded structure. The features illustrated in the side view 500 may be used in conjunction with other embodiments. For example, the edge coupler 520 represents one possible implementation of the edge couplers 314-1, 314-2 of FIGS. 3A-3I.

In the side view 500, an optical waveguide 505 (e.g., a silicon waveguide) is formed above the edge coupler 520 (e.g., the edge coupler 520 may be embedded in an insulation layer of the photonic chip, such as an oxide layer). The optical waveguide 505 couples an optical signal between one or more optical components (not shown) of the photonic chip and the edge coupler 520. In another embodiment, the multi-prong structure may be flipped relative to the optical waveguide 505, such that the prongs of the edge coupler 520 are formed in layers above the optical waveguide 505 (i.e., the optical waveguide 505 is between the prongs of the edge coupler 520 and the insulation layer).

As shown in the side view 500, one interface of the edge coupler 520 is coupled to the optical waveguide 505, while another interface is optically exposed at a side surface 525 of the photonic chip. In some embodiments, the side surface 525 is formed by performing a dicing process on the wafer assembly depicted in FIG. 3F. The side surface 525 in some cases may have further processing (e.g., polishing) to improve the optical coupling efficiency with an external light-carrying medium.

The edge coupler 520 includes a waveguide adapter 515 which can be optically coupled with an external light-carrying medium, such as an optical fiber of a FAU. The edge coupler 520 is made of separate prongs 510A, 510B, 510C that may include the same material (e.g., silicon nitride or silicon oxynitride) embedded in an insulative material (e.g., silicon dioxide or silicon oxynitride). In this way, the separate prongs 510A, 510B, 510C are disposed on different layers, and each layer of the different layers is separated by dielectric material (e.g., an oxide layer). In one embodiment, the material of the prongs 510A, 510B, 510C and the edge coupler 520 may be different from the material of the insulation layer of the photonic chip. Generally, the edge coupler 520 may be made of any material(s) having a higher refractive index than the material of the insulative material surrounding the prongs 510A, 510B, 510C.

Figure 6A:
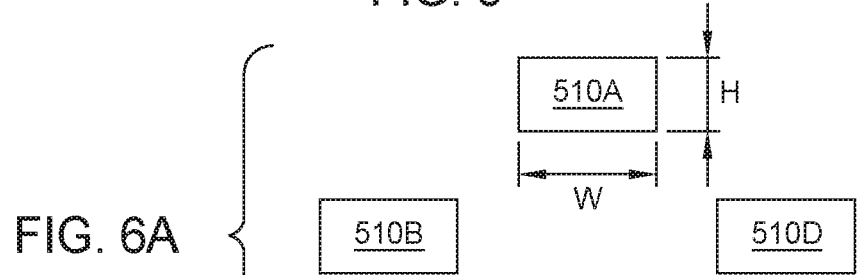

FIGS. 6A-6E illustrate cross-sectional views of the edge coupler 520 of FIG. 5, according to one or more embodiments. Specifically, FIG. 6A illustrates the cross-section A-A of a portion of the waveguide adapter 515 that is closest to the side surface 525 (or coupling interface). Here, the waveguide adapter 515 includes four separate prongs 510A, 510B, 510C, 510D that may have the same or similar width (W) and height (H) (or thickness) dimensions. These dimensions, as well as the spacing between the prongs 510A, 510B, 510C, 510D may vary depending on the specific application. In the example shown, the waveguide adapter 515 may be configured to interface with a single mode optical fiber with a 10 micron mode field diameter. As will be appreciated by one of ordinary skill in the art, these dimensions may vary depending on the specific application. Specifically, the dimensions may be chosen such that the mode of the prong at the coupling interface substantially matches the mode of the external device to which light is to be coupled to or from. As described herein, "substantially matches" includes a case in which the mode sizes are equal, as well as cases in which the mode sizes are within about 25% of each other. Here, the width of the prongs 510A, 510B, 510C, 510D may range from approximately 200-300 nanometers with a height between about 100-250 nanometers. More specifically, the width may be around 200 nanometers while the height is approximately 200 nanometers. The distance between prong 510A and prong 510C and the distance between prong 510D and prong 510B may be around two microns. As mentioned above, the dimensions, as well as the spacing, of the prongs 510A, 510B, 510C, 510D may vary according to the mode or design of the external light source coupled to the photonic chip.

Figure 6B:
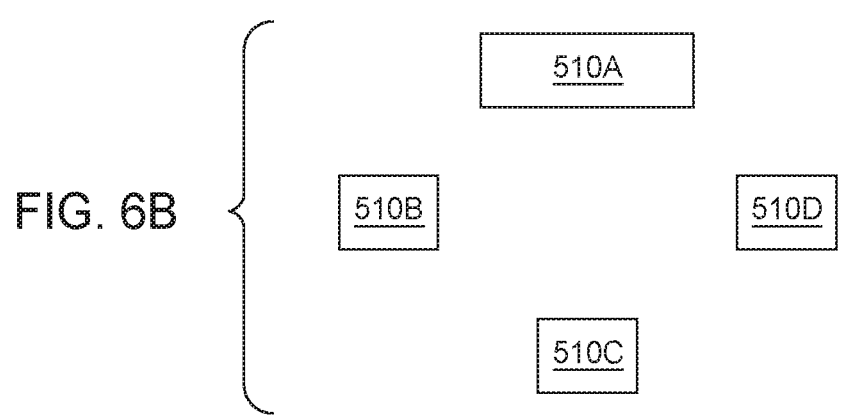

FIG. 6B illustrates the cross-section B-B of the waveguide adapter 515. This figure shows that as the multi-prong adapter is recessed away from the side surface 525, the width of the prongs 510B, 510C, 510D reduces while the width of prong 510A increases. As shown, the tapering of widths of the prongs 510A, 510B, 510C, 510D is done in an adiabatic fashion. The tapering results in a gradual transition of optical energy from an optical mode which is confined by the prongs 510A, 510B, 510C, 510D at the right side of the waveguide adapter 515 where the widths and heights of the prongs 510A, 510B, 510C, 510D are same or similar to a mode which is gradually confined more and more in the upper prong 510A at positions farther to the left in the waveguide adapter 515. This tapering transfers the optical energy confined by the prongs 510A, 510B, 510C, 510D to the prong 510A alone. However, the opposite is also true. That is, tapering the widths also enables a signal introduced in the upper prong t10A to be transferred to a mode confined by the prongs 510A, 510B, 510C, 510D as the optical signal propagates from left to right. The widths of the prongs 510A, 510B, 510C, 510D may change continuously (e.g., a linear or non-linear fashion such as exponentially or at higher order polynomial profiles) or, in an alternate embodiment, at discrete increments as the waveguide adapter 515 extends from right to left. As shown in FIG. 5, eventually the prongs 510B, 510C, 510D terminate (which ends the waveguide adapter 515) while the prong 510A continues to transmit the optical signal. In one embodiment, the waveguide adapter 515 may have a length of approximately 100 to 500 microns. Furthermore, the waveguide adapter 515 may taper for all of this length or for only a portion thereof. For example, the widths of the prongs 510A, 510B, 510C, 510D may remain substantially equivalent for the first five to fifty microns before the widths of the prongs 510A, 510B, 510C, 510D begin to change.

FIG. 6C illustrates the cross-section C-C of the edge coupler 520. Here, the waveguide adapter 515 has terminated which leaves the prong 510A to carry the optical signal. Although shown as being linear, the prong 510A may curve, bend, twist, etc. to carry the optical signal to different areas of the photonic chip or testing structure. Thus, the length of the prong 510A may be much larger than the lengths of the prongs 510B, 510C, 510D to enable the prong 510A to carry an optical signal to different areas.

FIG. 6D illustrates the cross-section D-D of the edge coupler 520 and the optical waveguide 505. As shown, the width of the prong 510A is larger than the width of the optical waveguide 505. Moreover, the distance between the prong 510A and the optical waveguide 505 may range from hundreds of nanometers to only a few nanometers depending on the techniques used to fabricate the wafer. Depending on the technique used to fabricate the semiconductor wafer, a portion of the prong 510A may directly contact the optical waveguide 505.

FIG. 6E illustrates the cross-section E-E of the edge coupler 520 and the optical waveguide 505. Here, the width of the prong 510A has shrunk while the width of the optical waveguide 505 has increased. This tapering, which is again shown in an adiabatic fashion, results in the optical signal in the prong 510A to transfer to the optical waveguide 505 and vice versa with minimal loss. Eventually, the prong 510A terminates and the optical waveguide 505 may carry the optical signal to different optical components, e.g., in the photonic chip.

Although the embodiments above discuss tapering the prongs 510A, 510B, 510C, 510D by changing the width, a similar transfer of optical power may occur if the heights are tapered, or some combination of both. However, tapering the height of the prongs 510A, 510B, 510C, 510D may require different lithography and fabrication techniques or materials than tapering the widths as shown in FIGS. 6A-6E. It is also not necessary that the widths of all the prongs are tapered. For example, in certain designs the required transfer of optical energy can be obtained by just tapering the width of the prong 510A alone while the widths of prongs 510B, 510C, 510D are not tapered.

FIGS. 7A and 7B illustrate views of a tapered waveguide, according to one or more embodiments. More specifically, FIGS. 7A and 7B illustrate a partially overlapping, inverse-taper waveguide structure for transferring an optical signal between waveguides. As shown, FIG. 7A illustrates a plan view of a first tapered waveguide 705 partially overlapping a second tapered waveguide 710. Specifically, FIG. 7A may be the arrangement of the portion of a photonic chip in FIG. 5 where the optical waveguide 505 overlaps the prong 510A. The tapering of the waveguides is done adiabatically to minimize optical loss. Although FIGS. 7A and 7B illustrate that the widths of the tapers vary linearly, the waveguides can also taper in a non-linear fashion, for example, exponential or some higher-order polynomial profile as long as the adiabatic criterion is satisfied. In one embodiment, the distance between the first tapered waveguide 705 and the second tapered waveguide 710 is less than a micron. For example, the first tapered waveguide 705 and the second tapered waveguide 710 may be separated by 100 nanometers or less. The separation distance may affect the efficiency with which an optical signal may transfer between the first tapered waveguide 705 and the second tapered waveguide 710, and thus, a structure may be designed such that the first tapered waveguide 705 and the second tapered waveguide 710 are as close as fabrication techniques allow.

FIG. 7B illustrates a top view of the first tapered waveguide 705 and the second tapered waveguide 710. By at least partially overlapping the first tapered waveguide 705 and the second tapered waveguide 710, an optical signal may be transferred between waveguides in different layers in the semiconductor wafer. In one embodiment, the first tapered waveguide 705 and the second tapered waveguide 710 partially overlap where their respective ends begin to taper. The slope or change of the taper may depend on the material used for forming the first tapered waveguide 705 and the second tapered waveguide 710. In one embodiment, at the widest point, the first tapered waveguide 705 and the second tapered waveguide 710 may have a width that ranges from 200 nanometers to 2 microns. At the narrowest point, the first tapered waveguide 705 and the second tapered waveguide 710 may have a width from 100 nanometers to 200 nanometers. The length of the tapering portion may range from 10 microns to 50 microns—e.g., around 20 microns.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method comprising:
bonding a photonic wafer with an electronic wafer to form a wafer assembly;
removing a substrate of the wafer assembly to expose a surface of the photonic wafer or of the electronic wafer;
disposing a dielectric layer on the exposed surface of the photonic wafer or of the electronic wafer;
forming a first via through the dielectric layer such that the first via connects to a metal layer of the electronic wafer;
forming a second via through the dielectric layer such that the second via connects to a metal layer of the photonic wafer;
receiving an interposer wafer comprising a plurality of through-vias;
adding the interposer wafer to the wafer assembly by bonding the interposer wafer to the dielectric layer, wherein the plurality of through-vias are coupled with the first via and the second via; and
dicing the wafer assembly to form a plurality of dies, wherein a respective edge coupler of each die is optically exposed at an interface formed by the dicing.

2. The method of claim 1, wherein one or both of (i) bonding the photonic wafer with the electronic wafer and (ii) bonding the interposer wafer to the dielectric layer comprise wafer-scale oxide-oxide bonding.

3. The method of claim 1,
wherein bonding the photonic wafer with the electronic wafer comprises wafer-scale hybrid bonding, and
wherein the wafer-scale hybrid bonding forms the electrical connections between metal layers of the photonic wafer and metal layers of the electronic wafer.

4. The method of claim 1,
wherein for each die of the plurality of dies, the respective edge coupler comprises a waveguide adapter optically coupled with an optical waveguide of a portion of the photonic wafer that is included in the die, and
wherein the waveguide adapter is configured to transition an optical mode of an optical signal between a first, smaller mode size at the optical waveguide and a second, larger mode size that substantially matches a mode size of an external light-carrying medium.

5. The method of claim 4, wherein the waveguide adapter comprises at least one tapered waveguide configured to adjust a diameter of the optical mode.

6. The method of claim 4,
wherein the waveguide adapter comprises a multi-prong structure disposed on different layers, and
wherein each layer of the different layers is separated by a dielectric material.

7. The method of claim 1, further comprising:
attaching an external light-carrying medium to a first die of the plurality of dies, wherein the external light-carrying medium is optically coupled with the edge coupler of the first die.

8. The method of claim 7, wherein attaching the external light-carrying medium to the first die comprises:
applying an index-matching material between the interface of the first die and the external light-carrying medium; and
curing the index-matching material.

9. The method of claim 7, wherein the external light-carrying medium is one of: an optical waveguide of an external photonic chip, an edge coupler of the external photonic chip, a laser, a light emitting diode, an individual optical fiber, and a fiber array unit arranging a plurality of optical fibers.

10. The method of claim 1, further comprising:
prior to dicing the wafer assembly, forming surface mount connectors electrically coupled with the through-vias.

11. The method of claim 10, further comprising:
electrically coupling the surface mount connectors of a first die of the plurality of dies with electrical contacts of an integrated circuit substrate.

12. The method of claim 11, wherein removing the substrate of the wafer assembly comprises removing a first substrate of the wafer assembly and leaving a second substrate of the wafer assembly, the method further comprising:
applying, after electrically coupling the surface mount connectors included in the first die, a thermal interface material to a portion of the second substrate included in the first die; and
attaching a thermal lid to the first die through the thermal interface material.

13. A method comprising:
forming a plurality of optical components in a photonic wafer, wherein the plurality of optical components comprises a plurality of edge couplers;
forming a plurality of electronic components in an electronic wafer;
bonding the photonic wafer with the electronic wafer to form a wafer assembly;
disposing a dielectric layer on an exposed surface of the photonic wafer or of the electronic wafer;
forming a first via through the dielectric layer such that the first via connects to a metal layer of the electronic wafer;
forming a second via through the dielectric layer such that the second via connects to a metal layer of the photonic wafer;
receiving an interposer wafer comprising a plurality of through-vias;
adding the interposer wafer to the wafer assembly by bonding the interposer wafer to the dielectric layer, wherein the plurality of through-vias are coupled with first via and the second via; and
dicing the wafer assembly to form a plurality of dies, wherein a respective edge coupler of each die is optically exposed at an interface formed by the dicing.

14. The method of claim 13, further comprising:
forming the exposed surface by removing a substrate of the photonic wafer or of the electronic wafer.

15. The method of claim 13, wherein one or both of (i) bonding the photonic wafer with the electronic wafer and (ii) bonding the interposer wafer to the dielectric layer comprise wafer-scale oxide-oxide bonding.

16. The method of claim 13,
wherein bonding the photonic wafer with the electronic wafer comprises wafer-scale hybrid bonding, and
wherein the wafer-scale hybrid bonding forms electrical connections between metal layers of the photonic wafer and metal layers of the electronic wafer.

17. The method of claim 13,
wherein for each die of the plurality of dies, the respective edge coupler comprises a waveguide adapter optically coupled with an optical waveguide of a portion of the photonic wafer that is included in the die, and
wherein the waveguide adapter is configured to transition an optical mode of an optical signal between a first, smaller mode size at the optical waveguide and a second, larger mode size that substantially matches a mode size of an external light-carrying medium.

18. The method of claim 17, wherein the waveguide adapter comprises at least one tapered waveguide configured to adjust a diameter of the optical mode.

19. The method of claim 17,
wherein the waveguide adapter comprises a multi-prong structure disposed on different layers, and
wherein each layer of the different layers is separated by a dielectric material.

20. The method of claim 13, further comprising:
attaching an external light-carrying medium to a first die of the plurality of dies, wherein the external light-carrying medium is optically coupled with the edge coupler of the first die.

21. The method of claim 20, wherein attaching the external light-carrying medium to the first die comprises:
applying an index-matching material between the interface of the first die and the external light-carrying medium; and
curing the index-matching material.

22. The method of claim 20, wherein the external light-carrying medium is one of: an optical waveguide of an external photonic chip, an edge coupler of the external photonic chip, a laser, a light emitting diode, and an optical fiber.

23. A wafer assembly for forming a plurality of dies, the wafer assembly comprising:
a photonic wafer comprising a plurality of optical components, wherein the plurality of optical components comprises a plurality of edge couplers that are arranged such that a respective edge coupler of each die of the plurality of dies will be optically exposed at a dicing interface;
an electronic wafer having a first surface bonded with a second surface of the photonic wafer, wherein the electronic wafer comprises a plurality of electronic components, and wherein electrical connections are formed between the plurality of optical components and the plurality of electronic components;
a dielectric layer comprising (i) a first via through the dielectric layer such that the first via connects to a metal layer of the electronic wafer and (ii) a second via through the dielectric layer such that the second via connects to a metal layer of the photonic wafer, wherein the dielectric layer is disposed on a third surface that is one of (i) a surface of the electronic wafer opposite the first surface or (ii) a surface of the photonic wafer opposite the second surface; and
an interposer wafer comprising a plurality of through-vias, wherein the plurality of through vias are coupled with the first via and the second via.

\* \* \* \* \*

UNITED STATES PATENT AND TRADEMARK OFFICE
CERTIFICATE OF CORRECTION

PATENT NO. : 11,391,888 B2
APPLICATION NO. : 16/677404
DATED : July 19, 2022
INVENTOR(S) : Razdan et al.

It is certified that error appears in the above-identified patent and that said Letters Patent is hereby corrected as shown below:

In the Specification

In Column 2, Line 46, delete "through vias" and insert -- through-vias --.

In Column 9, Line 41, delete "5106," and insert -- 510B, --.

In Column 9, Line 45, delete "5106," and insert -- 510B, --.

In Column 9, Line 48, delete "5106," and insert -- 510B, --.

In Column 9, Line 53, delete "5106," and insert -- 510B, --.

In Column 9, Line 60, delete "5106," and insert -- 510B, --.

In Column 9, Line 62, delete "5106," and insert -- 510B, --.

In Column 10, Line 44, delete "5106," and insert -- 510B, --.

In Column 10, Line 50, delete "5106," and insert -- 510B, --.

In Column 10, Line 52, delete "5106," and insert -- 510B, --.

In Column 10, Line 61, delete "5106," and insert -- 510B, --.

In the Claims

In Column 13, Line 36, in Claim 3, after "forms" delete "the".

In Column 16, Line 25, in Claim 23, delete "through vias" and insert -- through-vias --.

Signed and Sealed this
Eleventh Day of October, 2022

*Katherine Kelly Vidal*
Katherine Kelly Vidal
*Director of the United States Patent and Trademark Office*